(12) United States Patent
Allen et al.

(10) Patent No.: US 7,260,790 B2
(45) Date of Patent: Aug. 21, 2007

(54) INTEGRATED CIRCUIT YIELD ENHANCEMENT USING VORONOI DIAGRAMS

(75) Inventors: Robert J. Allen, Jericho, VT (US);
Michael S. Gray, Fairfax, VT (US);
Jason D. Hibbeler, Williston, VT (US);
Mervyn Yee-Min Tan, South Burlington, VT (US); Robert F. Walker, St. George, VT (US)

(73) Assignee: International Business Machines Corporation, Armonk, NY (US)

( * ) Notice: Subject to any disclaimer, the term of this patent is extended or adjusted under 35 U.S.C. 154(b) by 399 days.

(21) Appl. No.: 10/709,292

(22) Filed: Apr. 27, 2004

(65) Prior Publication Data

US 2006/0150130 A1    Jul. 6, 2006

(51) Int. Cl.
*G06F 17/50* (2006.01)
(52) U.S. Cl. ............................. 716/2; 716/10
(58) Field of Classification Search ................ 716/4, 716/5, 7, 19, 2, 10; 438/14
See application file for complete search history.

(56) References Cited

U.S. PATENT DOCUMENTS

| | | | | |
|---|---|---|---|---|
| 5,773,315 A | * | 6/1998 | Jarvis | 438/14 |
| 5,777,901 A | * | 7/1998 | Berezin et al. | 716/19 |
| 6,066,179 A | * | 5/2000 | Allan | 716/4 |
| 6,178,539 B1 | * | 1/2001 | Papadopoulou et al. | 716/7 |
| 6,247,853 B1 | * | 6/2001 | Papadopoulou et al. | 716/4 |
| 6,317,859 B1 | * | 11/2001 | Papadopoulou | 716/4 |
| 6,918,101 B1 | * | 7/2005 | Satya et al. | 716/5 |
| 6,948,141 B1 | * | 9/2005 | Satya et al. | 716/4 |

OTHER PUBLICATIONS

Papadopoulou, E. and Lee, D.T., "Critical area computation via Voronoi diagrams," Computer-Aided Design of Integrated Circuits and Systems, IEEE Transactions on, vol. 18, No. 4, pp. 463-474, Apr. 1999.

Papadopoulou, E., Critical area computation for missing material defects in VLSI circuits, Computer-Aided Design of Integrated Circuits and Systems, IEEE Transactions on, vol. 20, No. 5, pp. 583-597, May 2001.

Fook-Luen Heng and Zhan Chen. "VLSI Yield Enhancement Techniques Through Layout Modification." IBM T. J. Watson Research Center, pp. 1-15, Jul. 17, 2000.

A. Venkataraman and I. Koren. "Trade-offs between Yield and Reliability Enhancement." Proc. of the 1996 IEEE National Symposium on Defect and Fault Tolerance in VLSI Systems, pp. 67-75, Nov. 1996.

* cited by examiner

*Primary Examiner*—Stacy A Whitmore
(74) *Attorney, Agent, or Firm*—Gibb & Rahman, LLC; Richard Kotulak, Esq.

(57) ABSTRACT

A method of calculating critical area in an integrated circuit design, said method comprising: inputting an integrated circuit design; associating variables with the positions of edges in said integrated circuit design; and associating cost functions of said variables with spacing between said edges in said integrated circuit design; wherein said cost functions calculate critical area contributions as the positions and length of said edges in said integrated circuit design change, and wherein said critical area contributions comprise a measure of electrical fault characteristics of said spacing between said edges in said integrated circuit design.

33 Claims, 17 Drawing Sheets

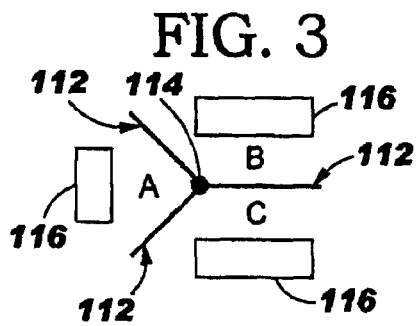
FIG. 3
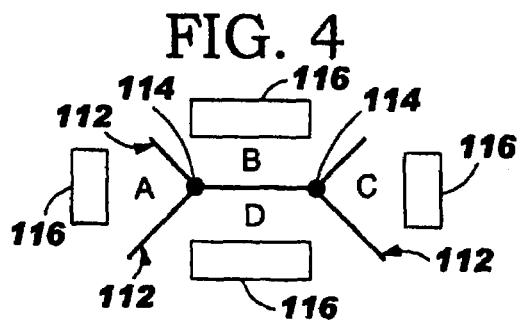
FIG. 4
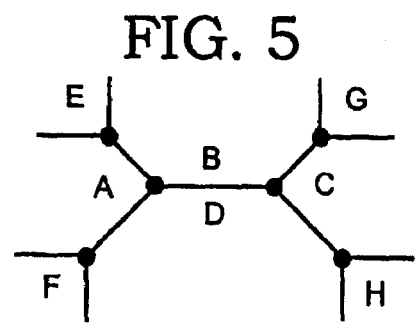
FIG. 5
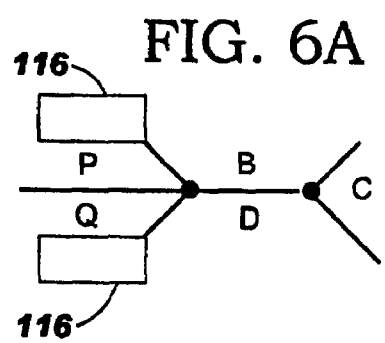
FIG. 6A
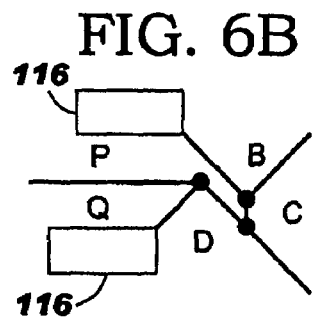
FIG. 6B
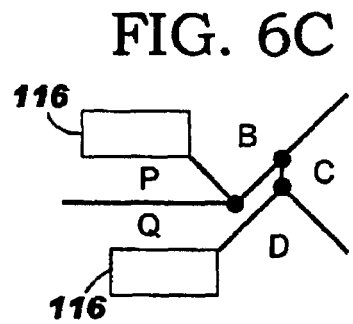
FIG. 6C
FIG. 7A
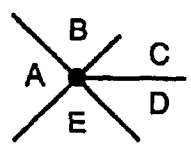

FIG. 9A

Bisector(A, B, C, D) = a rotation or reflection of gradients((-1,0), (0,1), (1,0), (0,-1))

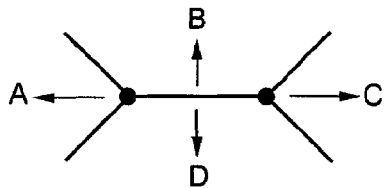

$widthCA = x_C - x_A$ $widthBD = y_B - y_D$ $CriticalArea = -\dfrac{k(widthCA - widthBD)}{widthBD}$ $widthCA - widthBD \geq 0$ $widthBD \leq 0$

FIG. 9B

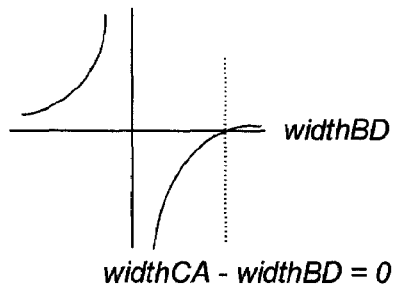

widthBD widthCA - widthBD = 0

FIG. 9C

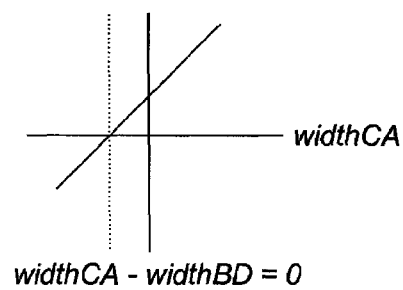

widthCA widthCA - widthBD = 0

FIG. 10A

Bisector(A, B, C, D) = a rotation or reflection of gradients ((1,0), (0,1), (-1,0), (0,-1))

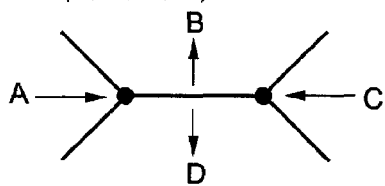

$widthCA = x_C - x_A$ $widthBD = y_B - y_D$ $CriticalArea = -\dfrac{k(widthCA + widthBD)}{widthBD}$ $widthCA + widthBD \geq 0$ $widthBD \leq 0$

FIG. 10B

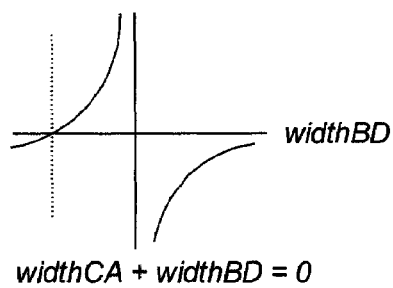

widthBD widthCA + widthBD = 0

FIG. 10C

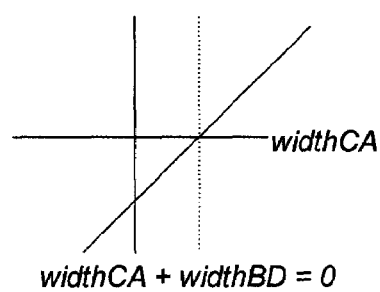

widthCA widthCA + widthBD = 0

FIG. 11A
Bisector(A, B, C, D) = a rotation or reflection of gradients ((1,0), (0,1), (1,0), (0,-1))
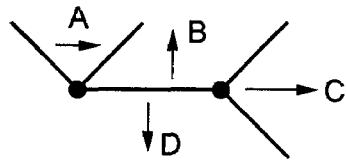
$widthCA = x_C - x_A$
$widthBD = y_B - y_D$
$CriticalArea = -k \dfrac{widthCA}{widthBD}$
$widthCA \geq 0$
$widthBD \leq 0$
FIG. 11B         FIG. 11C
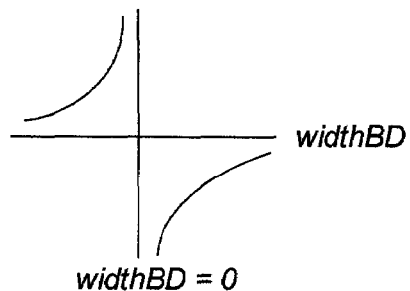
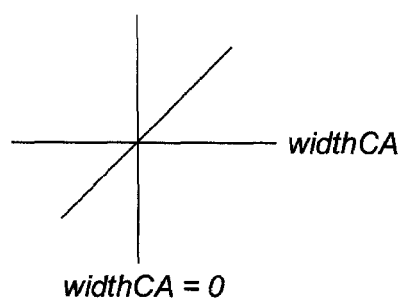
FIG. 12A
Bisector(A, B, C, D) = a rotation or reflection of gradients ((0,1), (1,0), (0,1), (0,-1))
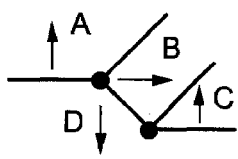
$widthDC = y_D - y_C$
$widthDA = y_D - y_A$
$CriticalArea = \dfrac{k}{2} \ln \dfrac{widthDC}{widthDA}$
$widthDC - widthDA \geq 0$
$widthDA \geq 0$
FIG. 12B         FIG. 12C
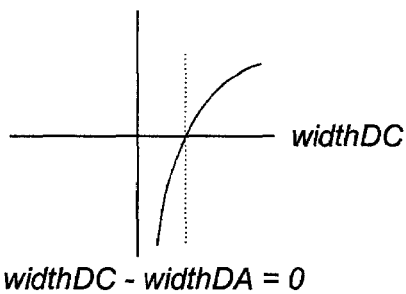
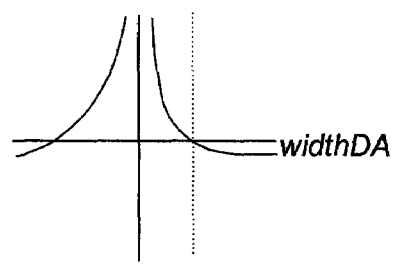

FIG. 13A

Bisector(A, B, C, D) = a rotation or reflection of gradients ((0,1), (1,0), (-1,0), (0,-1))

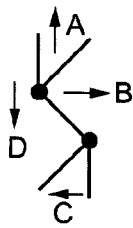

$widthDA = y_D - y_A$
$widthCB = x_C - x_B$
$CriticalArea = \dfrac{k}{2} \ln \dfrac{widthCB}{widthDA}$
$widthCB - widthDA \geq 0$
$widthDA \geq 0$

FIG. 13B
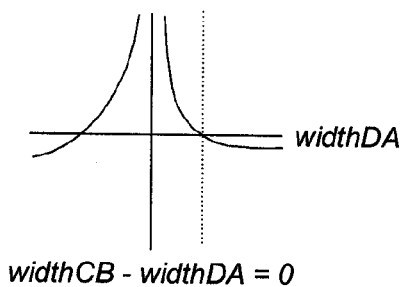
$widthCB - widthDA = 0$

FIG. 13C
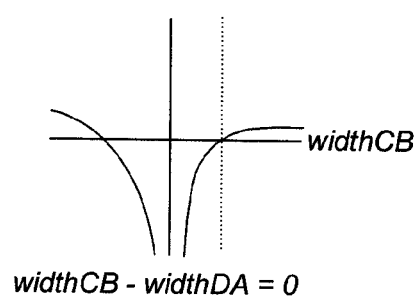
$widthCB - widthDA = 0$

FIG. 14A

Bisector(A, B, C, D) = a rotation or reflection gradients ((-1,0), (0,1), β(1,0), (0,-1))

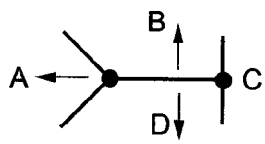

$widthCA = x_C - x_A$
$widthBD = y_B - y_D$
$CriticalArea = -\dfrac{k\left(widthCA - \frac{1}{2}widthBD\right)}{widthBD}$
$widthCA - \frac{1}{2}widthBD \geq 0$
$widthBD \leq 0$

FIG. 14B
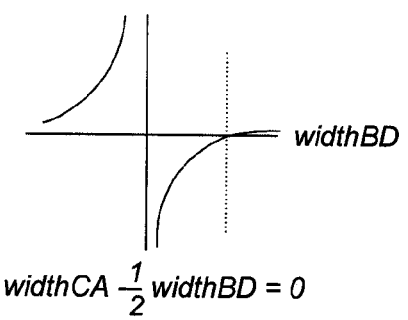
$widthCA - \frac{1}{2}widthBD = 0$

FIG. 14C
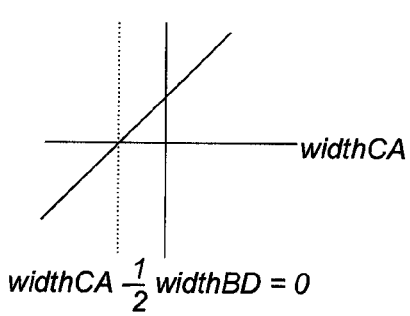
$widthCA - \frac{1}{2}widthBD = 0$

FIG. 15A

Bisector(A, B, C, D) = a rotation or reflection of gradients $((1,0), (0,1), \beta(1,0), (0,-1))$

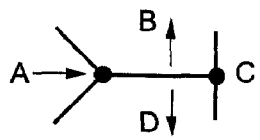

$widthCA = x_C - x_A$
$widthBD = y_B - y_D$ $$CriticalArea = -\frac{k\left(widthCA + \frac{1}{2} widthBD\right)}{widthBD}$$

$widthCA + \frac{1}{2} widthBD \geq 0$
$widthBD \leq 0$

FIG. 15B

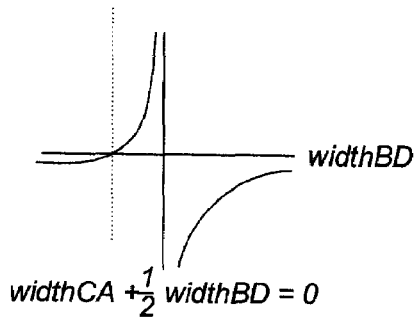

$widthCA + \frac{1}{2} widthBD = 0$

FIG. 15C

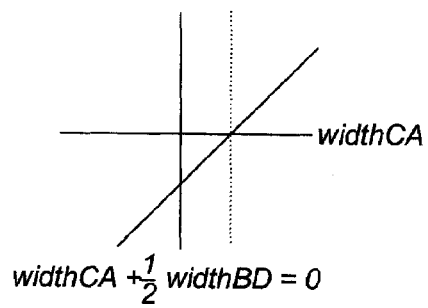

$widthCA + \frac{1}{2} widthBD = 0$

FIG. 16A

Bisector(A, B, C, D) = a rotation or reflection of gradients $((0,1), (1,0), \beta(1,0), (0,-1))$

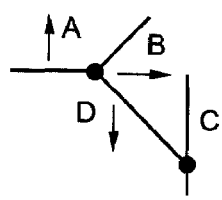

$widthDA = y_D - y_A$
$widthCB = x_C - x_B$ $$CriticalArea = \frac{k}{2}\left(\ln\frac{widthCB}{widthDA} + \ln 2\right)$$

$widthCB - \frac{1}{2} widthDA \geq 0$
$widthDA \geq 0$

FIG. 16B

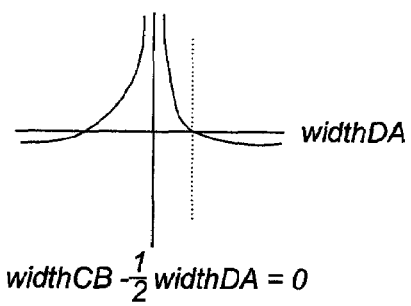

$widthCB - \frac{1}{2} widthDA = 0$

FIG. 16C

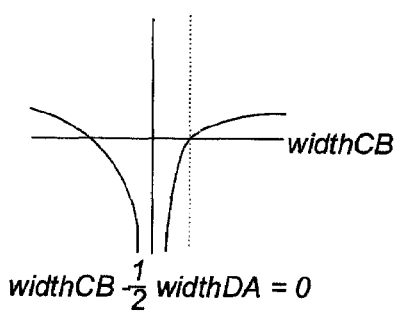

$widthCB - \frac{1}{2} widthDA = 0$

FIG. 17A

Bisector(A, B, C, D) = a linear transformation of $(\beta(1,0), (0,1), \beta(1,0), (0,-1))$

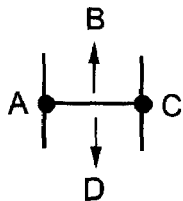

$widthCA = x_C - x_A$ $widthBD = y_B - y_D$ $CriticalArea = -k \dfrac{widthCA}{widthBD}$ $widthCA \geq 0$ $widthBD \leq 0$

FIG. 17B

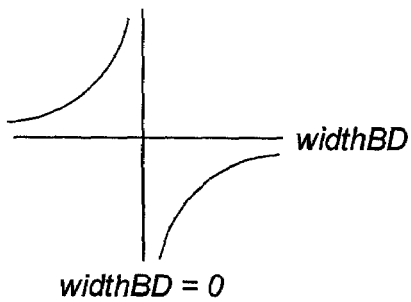

$widthBD = 0$

FIG. 17C

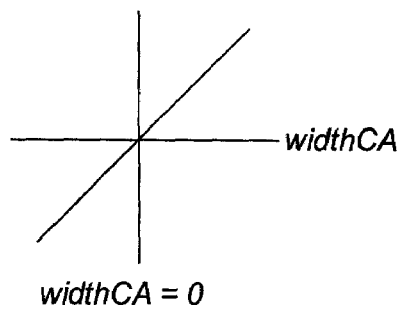

$widthCA = 0$

FIG. 18A

Bisector(A, B, C, D) = a rotation or reflection of gradients $((-1,0), (0,-1), (1,0), (0,1))$

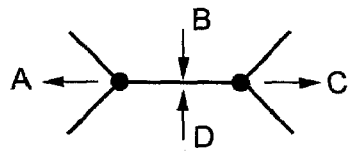

$widthCA = x_C - x_A$ $widthBD = y_B - y_D$ $CriticalArea = -\dfrac{k\,(widthCA + widthBD)}{widthBD}$ $widthCA + widthBA \geq 0$ $widthBD \geq 0$

FIG. 18B

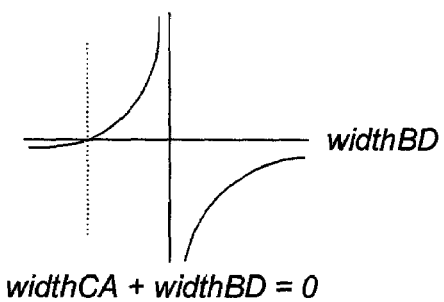

$widthCA + widthBD = 0$

FIG. 18C

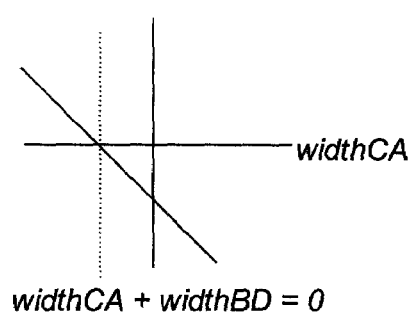

$widthCA + widthBD = 0$

FIG. 19A

Bisector(A, B, C, D) = a rotation or reflection of gradients ((1,0), (0,-1), (-1,0), (0,1))

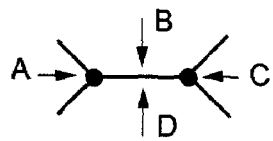

$widthCA = x_C - x_A$
$widthBD = y_B - y_D$ $$CriticalArea = -\frac{k\,(widthCA - widthBD)}{widthBD}$$

$widthCA - widthBD \geq 0$
$widthBD \geq 0$

FIG. 19B

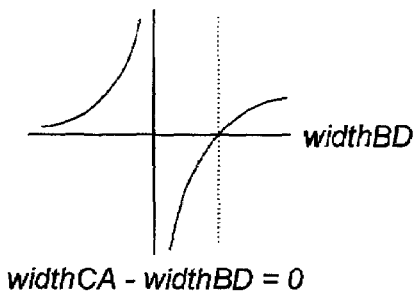

$widthCA - widthBD = 0$

FIG. 19C

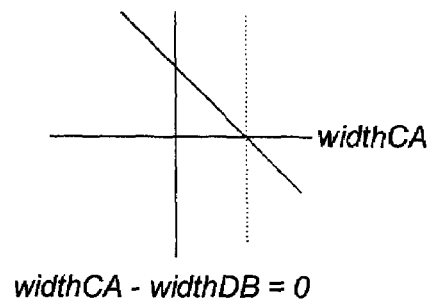

$widthCA - widthDB = 0$

FIG. 20A

Bisector(A, B, C, D) = a rotation or reflection of gradients ((1,0), (0,-1), (1,0), (0,1))

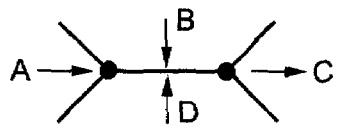

$widthCA = x_C - x_A$
$widthBD = y_B - y_D$ $$CriticalArea = -k\,\frac{widthCA}{widthBD}$$

$widthCA \geq 0$
$widthBD \geq 0$

FIG. 20B

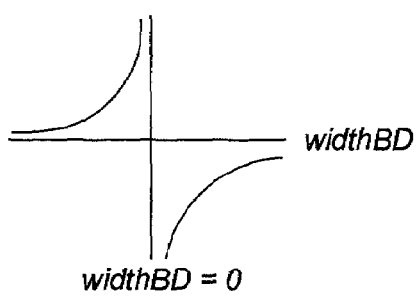

$widthBD = 0$

FIG. 20C

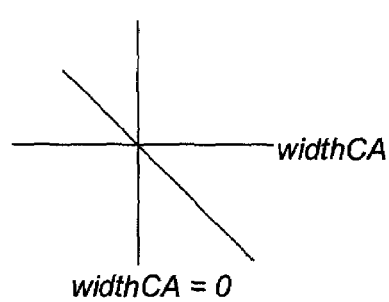

$widthCA = 0$

FIG. 21A

Bisector(A, B, C, D) = a rotation or reflection of gradients ((0,1), (0,-1), (0,1), (1,0))

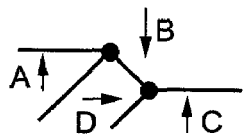

$widthBC = y_B - y_C$ $widthBA = y_B - y_A$ $CriticalArea = -\dfrac{k}{2} \ln \dfrac{widthBC}{widthBA}$ $widthBC - widthBA \geq 0$ $widthBA \geq 0$

FIG. 21B

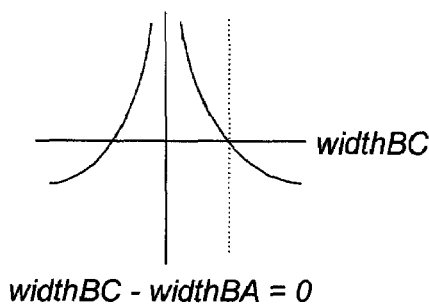

$widthBC - widthBA = 0$

FIG. 21C

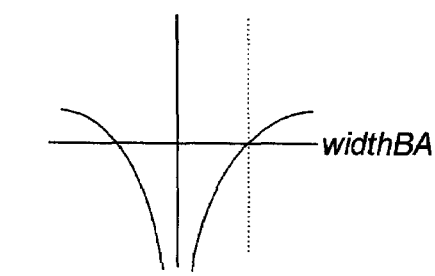

$widthBC - widthBA = 0$

FIG. 22A

Bisector(A, B, C, D) = a rotation or reflection of gradients ((0,1), (0,-1), (-1,0), (1,0))

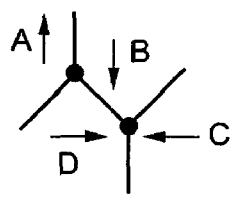

$widthBA = y_B - y_A$ $widthCD = x_C - x_D$ $CriticalArea = -\dfrac{k}{2} \ln \dfrac{widthCD}{widthBA}$ $widthCD - widthBA \geq 0$ $widthBA \geq 0$

FIG. 22B

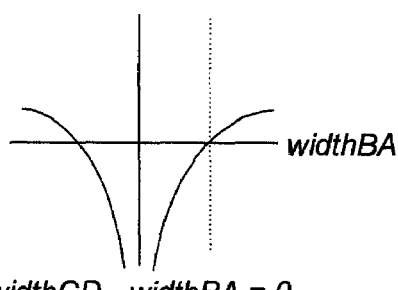

$widthCD - widthBA = 0$

FIG. 22C

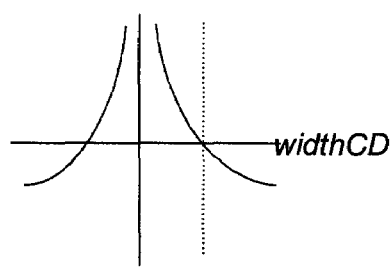

$widthCD - widthBA = 0$

FIG. 23A

Bisector(A, B, C, D) = a rotation or reflection of gradients $((-1,0), (0,-1), \beta(1,0), (0,1))$

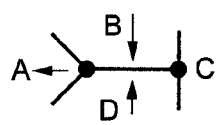

$widthCA = x_C - x_A$
$widthBD = y_B - y_D$ $$CriticalArea = -\frac{k\left(widthCA + \frac{1}{2}widthBD\right)}{widthBD}$$

$widthCA + \frac{1}{2}widthBD \geq 0$
$widthBD \geq 0$

FIG. 23B

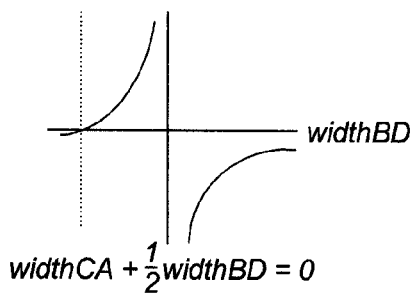

$widthCA + \frac{1}{2}widthBD = 0$

FIG. 23C

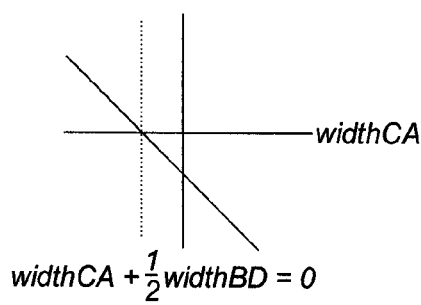

$widthCA + \frac{1}{2}widthBD = 0$

FIG. 24A

Bisector(A, B, C, D) = a rotation or reflection of gradients $((1,0), (0,-1), \beta(1,0), (0,1))$

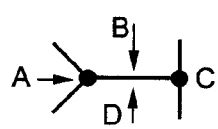

$widthCA = x_C - x_A$
$widthBD = y_B - y_D$ $$CriticalArea = -\frac{k\left(widthCA - \frac{1}{2}widthBD\right)}{widthBD}$$

$widthCA - \frac{1}{2}widthBD \geq 0$
$widthBD \geq 0$

FIG. 24B

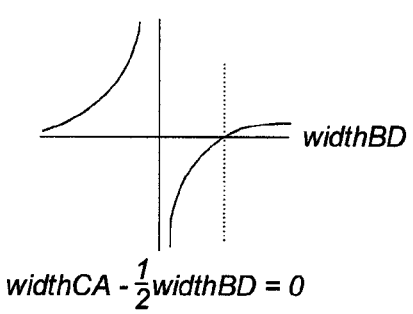

$widthCA - \frac{1}{2}widthBD = 0$

FIG. 24C

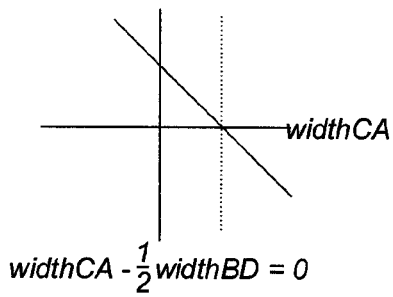

$widthCA - \frac{1}{2}widthBD = 0$

FIG. 25A

Bisector(A, B, C, D) = a rotation or reflection of gradients $((0,1), (0,-1), \beta(1,0), (1,0))$

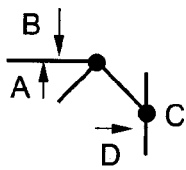

$widthDC = y_D - y_C$
$widthBA = y_B - y_A$ $CriticalArea = -\dfrac{k}{2}\left(\ln\dfrac{widthCD}{widthBA} + \ln 2\right)$ $widthCD - \dfrac{1}{2}widthBA \geq 0$
$widthBA \geq 0$

FIG. 25B
FIG. 25C

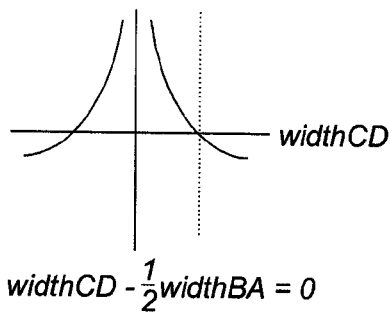

$widthCD - \dfrac{1}{2}widthBA = 0$

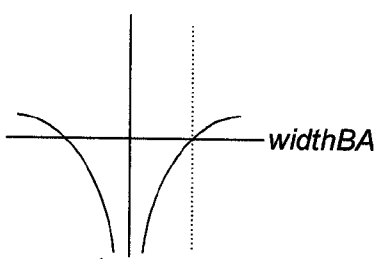

$widthCD = \dfrac{1}{2}widthBA = 0$

FIG. 26A

Bisector(A, B, C, D) = a rotation or reflections of gradients $(\beta(1,0), (0,1), \beta(1,0), (0,-1))$

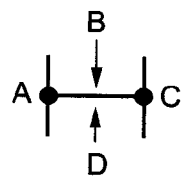

$widthCA = x_C - x_A$
$widthBD = y_B - y_D$ $CriticalArea = -k\dfrac{widthCA}{widthBD}$ $widthCA \geq 0$
$widthBD \geq 0$

FIG. 26B
FIG. 26C

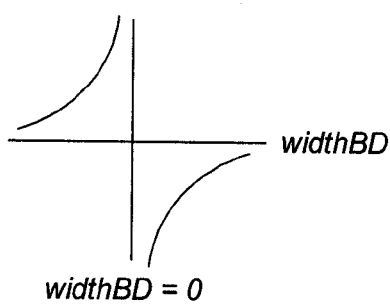

$widthBD = 0$

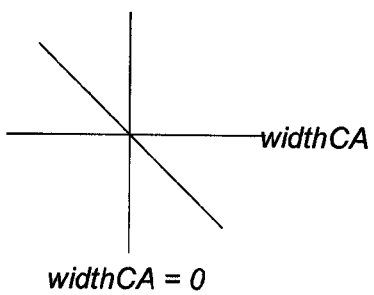

$widthCA = 0$

FIG. 27A

Bisector(A, B, C, D) = a rotation or reflection of gradients $((-1,0), \beta(0,1), (1,0), (0,1))$

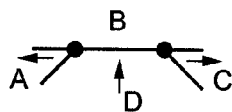

$widthCA = x_C - x_A$
$widthBD = y_B - y_D$ $CriticalArea = -\dfrac{k\left(\frac{1}{2}widthCA + widthBD\right)}{2 \, widthBD}$ $\frac{1}{2}widthCA + widthBD \geq 0$
$widthBD \geq 0$

FIG. 27B  FIG. 27C

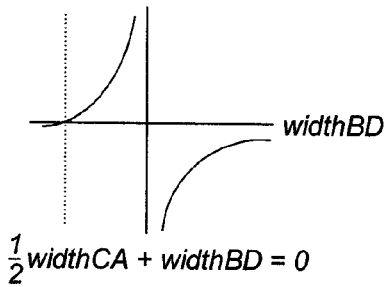

$\frac{1}{2}widthCA + widthBD = 0$

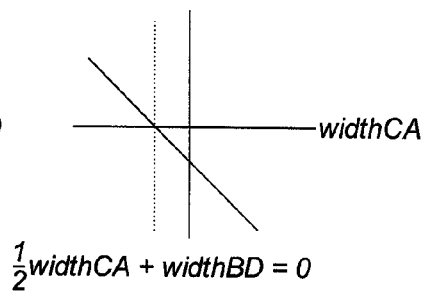

$\frac{1}{2}widthCA + widthBD = 0$

FIG. 28A

Bisector(A, B, C, D) = a rotation or reflection of gradients $((1,0), \beta(0,1), (-1,0), (0,1))$

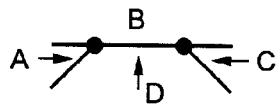

$widthCA = x_C - x_A$
$widthBD = y_B - y_D$ $CriticalArea = -\dfrac{k\left(\frac{1}{2}widthCA - widthBD\right)}{2 \, widthBD}$ $\frac{1}{2}widthCA - widthBD \geq 0$
$widthBD \geq 0$

FIG. 28B  FIG. 28C

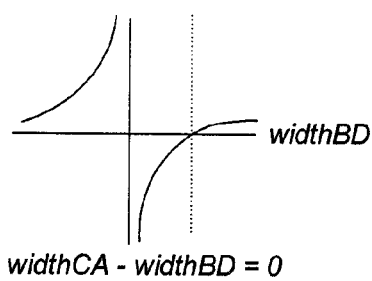

$widthCA - widthBD = 0$

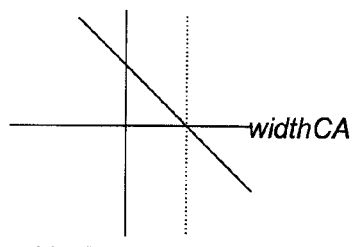

$widthCA - widthBD = 0$

FIG. 29A

Bisector(A, B, C, D) = a rotation or reflection of gradients ((1,0), β(0,1), (1,0), (0,1))

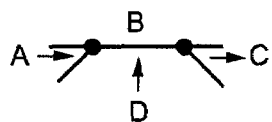

$widthCA = x_C - x_A$
$widthBD = y_B - y_D$ $CriticalArea = -k \dfrac{widthCA}{4\,widthBD}$ $widthCA \geq 0$
$widthBD \geq 0$

FIG. 29B

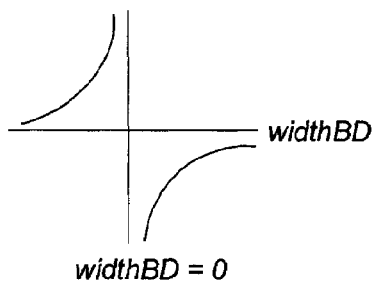

widthBD = 0

FIG. 29C

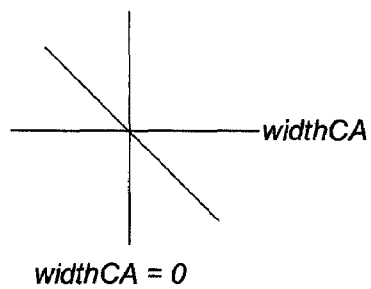

widthCA = 0

FIG. 30A

Bisector(A, B, C, D) = a rotation or reflection of gradients ((-1,0), β(0,1), β(1,0), (0,1))

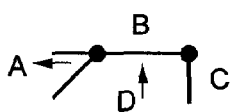

$widthCA = x_C - x_A$
$widthBD = y_B - y_D$ $CriticalArea = -\dfrac{k\,(widthCA + widthBD)}{4\,widthBD}$ $widthCA + widthBD \geq 0$
$widthBD \geq 0$

FIG. 30B

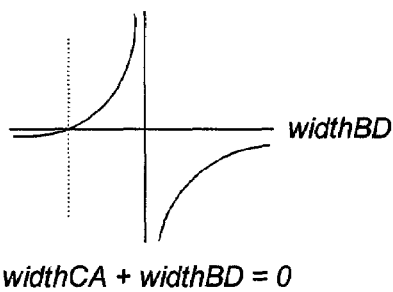

widthCA + widthBD = 0

FIG. 30C

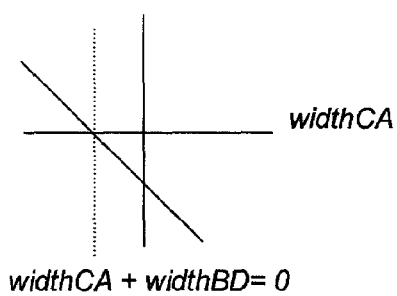

widthCA + widthBD = 0

FIG. 31A

Bisector(A, B, C, D) = a rotation or reflection of gradients $((1,0), \beta(0,1), \beta(1,0), (0,1))$

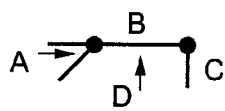

$widthCA = x_C - x_A$
$widthBD = y_B - y_D$ $CriticalArea = -\dfrac{k(widthCA - widthBD)}{4widthBD}$ $widthCA - widthBD \geq 0$
$widthBD \geq 0$

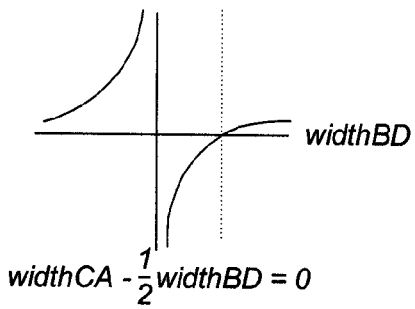

$widthCA - \dfrac{1}{2}widthBD = 0$

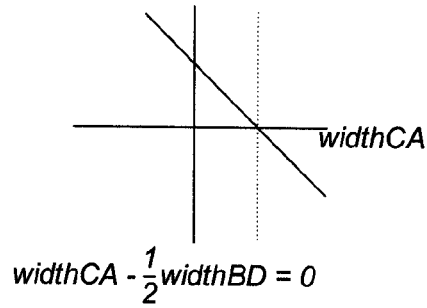

$widthCA - \dfrac{1}{2}widthBD = 0$

FIG. 32A

Bisector(A, B, C, D) = a rotation or reflection of gradients $(\beta(1,0), \beta(0,1), \beta(1,0), (0,1))$

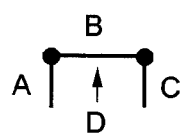

$widthCA = x_C - x_A$
$widthBD = y_B - y_D$ $CriticalArea = -k\dfrac{widthCA}{4widthBD}$ $widthCA \geq 0$
$widthBD \geq 0$

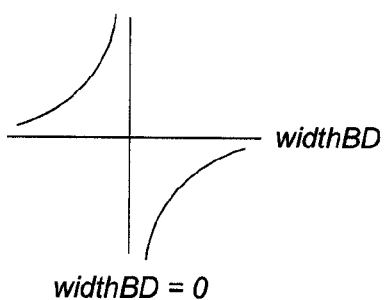

$widthBD = 0$

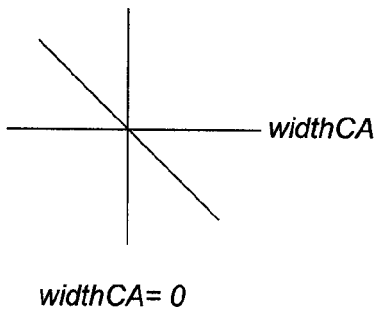

$widthCA = 0$

Bisector(A, B, C, D) = a rotation or reflection of gradients $((0,1), \beta(0,1), (0,1), (1,0))$ Ignored. No contribution to critical area.

Bisector(A, B, C, D) = a rotation or reflection of gradients $((0,1), \beta(0,1), (-1,0), (1,0))$ Ignored. No contribution to critical area.

Bisector(A, B, C, D) = a rotation or reflection of gradients $((0,1), \beta(0,1), \beta(1,0), (1,0))$ Ignored. No contribution to critical area.

INTEGRATED CIRCUIT YIELD ENHANCEMENT USING VORONOI DIAGRAMS

CROSS REFERENCE TO RELATED APPLICATIONS

The present application is related to pending U.S. patent application Ser. No. 10/709,293, filed concurrently herewith to Allen et al., entitled "CRITICAL AREA COMPOSITE FAULT MECHANISMS USING VORONOI DIAGRAMS". The foregoing application is assigned to the present assignee, and is incorporated herein by reference.

BACKGROUND OF INVENTION

1. Field of the Invention

The present invention generally relates to measuring critical area in integrated circuit design, and more particularly to a method that uses Voronoi diagrams to measure critical area as the design layout is changed.

2. Description of the Related Art

Within this application several publications are referenced by Arabic numerals within parentheses. Full citations for these, and other, publications may be found at the end of the specification immediately preceding the claims. The disclosures of all these publications in their entireties are hereby expressly incorporated by reference into the present application for the purposes of indicating the background of the present invention and illustrating the state of the art.

Advanced deep sub-micron technology enables millions of transistors to be fabricated on a single die. While this capability grants performance, the smaller size and higher density of layout features adversely affect yield [See: Papadopoulou, E., "Critical area computation for missing material defects in VLSI circuits, " *Computer-Aided Design of Integrated Circuits and Systems, IEEE Transactions* on, Vol. 20, No. 5, pp 583-597, May 2001; Fook-Luen Heng and Zhan Chen. "VLSI Yield Enhancement Techniques Through Lay-out Modification." IBM T. J. Watson Research Center; and A. Venkataraman and I. Koren. "Trade-offs between Yield and Reliability Enhancement." *Proc. of the 1996 IEEE National Symposium on Defect and Fault Tolerance in VLSI Systems*, pp. 67-75, November 1996]. Both the manufacturing process and geometry of the layout contribute to this loss of yield.

A part of this yield loss comes from random defects. These defects occur during the manufacturing process and cause electrical faults when the chip is active. The types of electrical faults that may result include, but are not limited to, short-circuits, wire-breaks, and via obstructions. The probability of yield loss due to random defects relates to the critical area of the layout, which can be measured using a Voronoi diagram technique [See: Papadopoulou, E. and Lee, D. T., "Critical area computation via Voronoi diagrams," *Computer-Aided Design of Integrated Circuits and Systems, IEEE Transactions* on, Vol. 18, No. 4, pp 463-474, April 1999].

Critical area of a very large scale integration (VLSI) layout is a measure that reflects the sensitivity of the layout to defects occurring during the manufacturing process. Critical area is widely used to predict the yield of a VLSI chip. Yield prediction is essential in today's VLSI manufacturing due to the growing need to control cost. Models for yield estimation are based on the concept of critical area which represents the main computational problem in the analysis of yield loss due to random (spot) defects during fabrication.

Spot defects are caused by particles such as dust and other contaminants in materials and equipment and are classified into two types: "extra material" defects causing shorts between different conducting regions and "missing material" defects causing open circuits.

In some defect modeling techniques, defects are modeled, consistently, as circles. The underlying reason for modeling defects as circles is the common use of Euclidean geometry. The distance between two points, usually, is measured by the length of the line segment joining the two points. This is the Euclidean distance. The locus of points a unit distance from a center point is usually called the "unit circle". In Euclidean geometry, the "unit circle" is a circle of radius one.

In reality, spot defects are not necessarily circular. They can have any kind of shape. Therefore, it seems appropriate to use other geometries if the critical area computation can be simplified by modeling defects as squares, diamonds or octagons. For practical purposes, a circular defect can certainly be approximated by a regular octagon. Yield estimation should not considerably depend on which of the above geometries is used to model defects as long as the geometry is chosen consistently. Therefore, the geometry used for a particular computation, preferably, should allow critical area computation in the most efficient way.

A Voronoi diagram can also be used to enhance the computation of critical area. A Voronoi diagram of a set of 2D geometric elements (polygons, line segments, points) is a partition of the plane into regions representing those points in the plane closest to a particular geometric element. Here, "closest" is defined in terms of an appropriate geometry as mentioned above. These regions are called Voronoi cells, each of which is associated with its defining geometric element, called the owner of the cell. The set of points which separates two Voronoi cells is called a Voronoi bisector. The point where three or more Voronoi bisectors (or Voronoi cells) meet is called a Voronoi vertex.

Based on the circuit design and under an appropriate geometry, Voronoi diagrams can be constructed to model the effect of extra-material and missing-material spot defects. The Voronoi diagram partitions the circuit design into Voronoi cells within which defects that occur cause electrical faults between the same two shape edges in the design. This information can then be used to compute critical area. (e.g., see U.S. Pat. Nos. 6,317,859, 6,247,853, and 6,178,539, which are incorporated herein by reference).

SUMMARY OF INVENTION

The invention provides a method of calculating critical area in an integrated circuit design. Starting with an initial integrated circuit design, the invention associates variables with the positions of the edges in the design. The invention associates cost functions involving the variables with the spacing among (between) these edges. The cost functions are in terms of critical area contributions. Critical area contributions comprise a measure of electrical fault characteristics of the spacing among edges. The invention optimizes the position and length of the edges to reduce critical area contribution cost in a first direction across the integrated circuit design to produce a revised integrated circuit design. Then, the invention optionally repeats this process with the revised integrated circuit design in a second direction to further reduce critical area contribution cost.

The process of associating cost functions maps points within the spacing among edges in the design to the size of defects at those points that trigger an electrical fault, forming Voronoi cells. These Voronoi cells define Voronoi bisectors and Voronoi vertices which encode the variables associated with the edges. The invention defines cost functions based on these Voronoi elements but independent of their geometry. The cost function models critical area contributions of the edges in the design layout as they change position and length in a continuous manner.

These, and other, aspects and objects of the present invention will be better appreciated and understood when considered in conjunction with the following description and the accompanying drawings. It should be understood, however, that the following description, while indicating preferred embodiments of the present invention and numerous specific details thereof, is given by way of illustration and not of limitation. Many changes and modifications may be made within the scope of the present invention without departing from the spirit thereof, and the invention includes all such modifications.

BRIEF DESCRIPTION OF DRAWINGS

The invention will be better understood from the following detailed description with reference to the drawings, in which:

FIG. 3 is a diagram showing Voronoi bisectors;

FIG. 4 is a diagram showing Voronoi bisectors;

FIG. 5 is a diagram showing Voronoi bisectors;

FIGS. 6A-6C are diagrams showing Voronoi bisectors;

FIGS. 7A-7F are diagrams showing Voronoi bisectors;

FIGS. 9A-9C illustrate bisectors, and graphical cost functions associated with bisectors;

FIGS. 10A-10C illustrate bisectors, and graphical cost functions associated with bisectors;

FIGS. 11A-11C illustrate bisectors, and graphical cost functions associated with bisectors;

FIGS. 12A-12C illustrate bisectors, and graphical cost functions associated with bisectors;

FIGS. 13A-13C illustrate bisectors, and graphical cost functions associated with bisectors;

FIGS. 14A-14C illustrate bisectors, and graphical cost functions associated with bisectors;

FIGS. 15A-15C illustrate bisectors, and graphical cost functions associated with bisectors;

FIGS. 16A-16C illustrate bisectors, and graphical cost functions associated with bisectors;

FIGS. 17A-17C illustrate bisectors, and graphical cost functions associated with bisectors;

FIGS. 18A-18C illustrate bisectors, and graphical cost functions associated with bisectors;

FIGS. 19A-19C illustrate bisectors, and graphical cost functions associated with bisectors;

FIGS. 20A-20C illustrate bisectors, and graphical cost functions associated with bisectors;

FIGS. 21A-21C illustrate bisectors, and graphical cost functions associated with bisectors;

FIGS. 22A-22C illustrate bisectors, and graphical cost functions associated with bisectors;

FIGS. 23A-23C illustrate bisectors, and graphical cost functions associated with bisectors;

FIGS. 24A-24C illustrate bisectors, and graphical cost functions associated with bisectors;

FIGS. 25A-25C illustrate bisectors, and graphical cost functions associated with bisectors;

FIGS. 26A-26C illustrate bisectors, and graphical cost functions associated with bisectors;

FIGS. 27A-27C illustrate bisectors, and graphical cost functions associated with bisectors;

FIGS. 28A-28C illustrate bisectors, and graphical cost functions associated with bisectors;

FIGS. 29A-29C illustrate bisectors, and graphical cost functions associated with bisectors;

FIGS. 30A-30C illustrate bisectors, and graphical cost functions associated with bisectors;

FIGS. 31A-31C illustrate bisectors, and graphical cost functions associated with bisectors;

FIGS. 32A-32C illustrate bisectors, and graphical cost functions associated with bisectors;

DETAILED DESCRIPTION

Figure 1A:
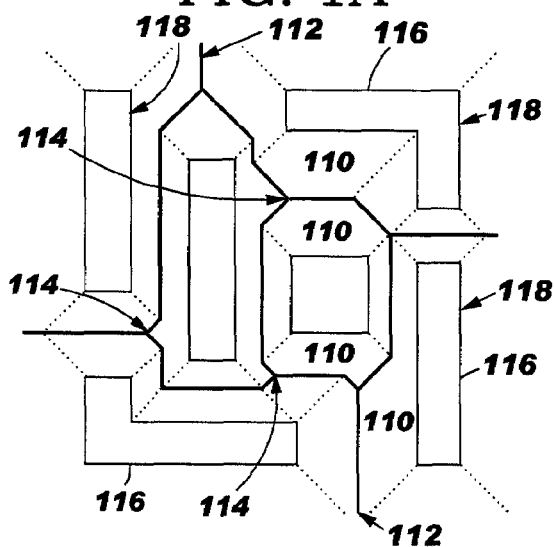
FIGS. 1A and 1B illustrate edges of design shapes and the Voronoi bisectors that are created between the design shapes.

The present invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

Figure 1B:
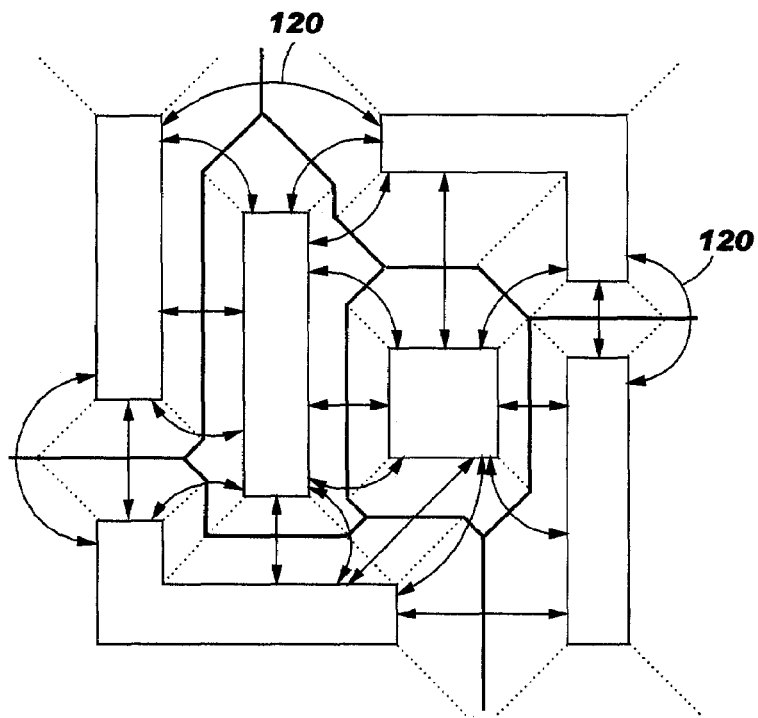

First, the invention constructs a weighted Voronoi diagram (shown in FIGS. 1A and 1B) for a particular electrical fault mechanism using known techniques. Denote this as Voronoi (fault). Electrical fault mechanisms are defined by the type of defect that may occur and one or more levels in the design involved in the fault. The Voronoi diagram that results maps points in the involved layout levels to their distance from edges of device shapes triggering the electrical fault (shown by the arrows in FIG. 1B). This Voronoi diagram partitions the layout into Voronoi cells 110, or sets of contiguous points which share common fault-triggering edges 118 of a device shape 116. The boundaries 112 between cells 110 are known as Voronoi bisectors 112. The points where two or more Voronoi bisectors 112 meet are known as Voronoi vertices 114.

Figure 2:
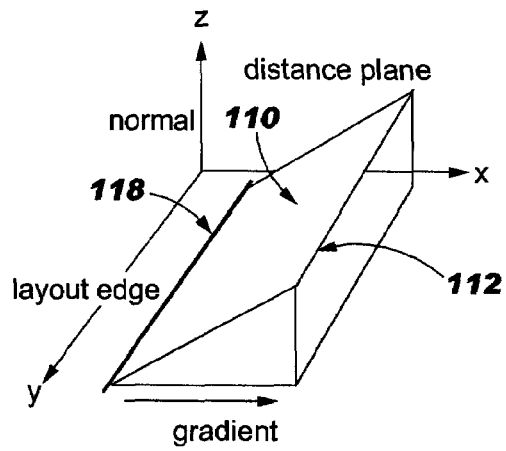
FIG. 2 is a Voronoi cell in three dimensions.

A visualization of the mapping provided by Voronoi (fault) is that of a three-dimensional surface (e.g., see FIG. 2). Imagine the layout design to be on the x-y plane and let the z-axis represent the mapped distance. The use of squares to model the shape of defects [1] results in Voronoi cells 110 that are piece-wise defined planar surfaces, and bisectors 112 that are linear. This three-dimensional surface can be described by some planar, piece-wise continuous function over the positions and orientation of the bisectors 112 in the layout.

Critical area represents the likelihood of a random defect and is a function over the surface the Voronoi diagram represents. The critical area within Voronoi (fault) is the sum of the critical areas contributions of its cells 110. Furthermore, the critical area contribution of each cell can be computed as the sum of the critical area contribution of the bisectors bordering the cell. This is achieved using a trapezoidal decomposition technique. This is achieved using a trapezoidal decomposition technique (as described in reference [1]) The goal of yield improvement here is to reduce the critical area within the layout. While Voronoi (fault) allows us to compute the current critical area, it does not describe how critical area changes as a result of layout modification. In the following sections, a set of cost functions are presented which describe critical area in terms of variables representing the positions of edges 118 in the design. This enables one to compute critical area as the edges 118 in the design change. This in turn enables one to optimize the geometry of the edges 118 in the design to reduce critical area and, thus, improve yield.

Let K represent an edge 118 in the design as shown in FIG. 2.

Let $\vec{x}_K = [x_K, y_K, 0]$ represent a point $[x_K, y_K]$ on K.

Let $\vec{g}_K = [g_{Kx}, g_{Ky}]$ represent the gradient of K.

The gradient of K is the direction of increasing distance from K. The gradient is perpendicular to the orientation of K in the L-infinity distance metric, for all possible orientations. Its magnitude is arbitrarily but consistently chosen.

For the rectilinear boundary around the entire layout design, we define special gradients as follows.

$$\vec{g}_{horizontal\,boundary} = \beta_{\langle 0,1 \rangle} \quad \vec{g}_{vertical\,boundary} = \beta_{\langle 1,0 \rangle}$$

Let $\vec{n}_K = \langle n_{Kx}, n_{Ky}, n_{Kz} \rangle$ represent the normal vector of the plane in three-dimensions representing distance away from $K$. For the $L$-infinity distance metric, $$\vec{n}_K = \begin{cases} \langle -g_{Kx}, -g_{Ky}, |g_{Kx}| + |g_{Ky}| \rangle & \vec{g}_K \notin \{\beta_{\langle 1,0 \rangle}, \beta_{\langle 0,1 \rangle}\} \\ \langle 1, 0, 0 \rangle & \vec{g}_K = \beta_{\langle 1,0 \rangle} \\ \langle 0, 1, 0 \rangle & \vec{g}_K = \beta_{\langle 0,1 \rangle} \end{cases}$$

In other words, this portion of the disclosure defines the normal vector that is based on the orientation (encoded in the gradient) of the edges in the design. It shall be used to represent the mapping described by Voronoi cells in a way that is independent of the geometry comprising the Voronoi diagram itself. This can then be used to formulate cost functions to calculate the critical area contribution of the various edges of shapes within the integrated circuit design subject to modification and avoids the need to reconstruct the Voronoi diagram under these modifications.

As shown in FIG. 3, Vertex (A, B, C) 114 represents the coordinate of a Voronoi vertex defined by edges A, B, and C of device shapes 116 in the design. This coordinate can be defined based on, but independent of, Voronoi vertices in the Voronoi diagram. Note that the devices, Voronoi bisectors, Voronoi vertices, etc. are not explicitly identified in all the drawings, so as to simplify the drawings and direct the reader's attention to the salient portions of the invention.

Vertex(A, B, C) =

-continued
$$\frac{(\vec{x}_A \bullet \vec{n}_A)(\vec{n}_B \times \vec{n}_C) + (\vec{x}_B \bullet \vec{n}_B)(\vec{n}_C \times \vec{n}_A) + (\vec{x}_C \bullet \vec{n}_C)(\vec{n}_A \times \vec{n}_B)}{\text{Det}[\vec{n}_A \, \vec{n}_B \, \vec{n}_C]}$$

● represents the dot-product operator x represents the cross-product operator

In other words, the coordinate of the vertex is a function of variables representing the positions and orientations (encoded as normals) associated with the involved edges in the design. This formulation is that of the intersection of the planes (as mentioned earlier) defined by the involved edges in the design.

As shown in FIG. 4, Bisector (A, B, C, D) 112 represents a Voronoi bisector whose geometry is defined by edges A, B, C, D of device shapes 116 in the design. These edges are stated in clockwise order around the bisector, such that B and D are on either side of the bisector. By definition, Bisector (A, B, C, D) it is a line segment between vertices 114 Vertex (A, B, D) and Vertex (B, C, D). Let Contribution (Bisector (A, B, C, D)) represent the critical area contribution associated with a Voronoi bisector defined by edges A, B, C, and D in the design. Using squares to model the shape of defects, applying a trapezoidal decomposition technique (as described in Papadopoulou, E. and Lee, D. T., "Critical area computation via Voronoi diagrams," *Computer-Aided Design of Integrated Circuits and Systems, IEEE Transactions on*, Vol. 18, No. 4, pp 463-474, April 1999.), and applying the equations derived above, critical area contribution is given by $$\text{Contribution}(\text{Bisector}(A, B, C, D)) = \kappa(\text{NormalXY}(B) - \text{NormalXY}(D)) \times$$
$$\left( \frac{\text{Vertex}(C, B, D)_{xy} - \text{Vertex}(A, B, D)_{xy}}{\text{Vertex}(C, B, D)_z - \text{Vertex}(A, B, D)_z} \ln \frac{\text{Vertex}(C, B, D)_z}{\text{Vertex}(A, B, D)_z} \right)$$

where $\kappa$ is a constant and $$\text{NormalXY}(K) = \frac{n_{Kz}}{\vec{n}_{Kxy}^2} \vec{n}_{Kxy}$$

and for any vector $\vec{r} = \langle x, y, z \rangle$, $$\vec{r}_{xy} = \langle x, y \rangle$$
$$r_z = z$$

In other words, the critical area contribution of a Voronoi bisector is a function of the orientation (encoded as normals) and positions of edges in the design. The critical area contribution of each Voronoi bisector is proportional to the cross product of two vectors the x-y difference vector between the normal vectors of the planes which meet at the bisector, and the x-y difference vector representing the length of the bisector. The factor of proportionality is some constant times the logarithm of the z-coordinates of the vertices of the bisector divided by the difference in the z-coordinates of the vertices of the bisector.

This equation is valid until the bisector or an adjacent bisector collapses to zero-length, resulting in a topological change in the Voronoi diagram. Having expressed the critical area contribution of a Voronoi bisector as a function of edges in the design enables the invention to predict change in critical areas as a result of layout modification. Based on the properties of the Voronoi diagram, the following observations can be made. Under continuous layout modification, the vertices in the Voronoi diagram shift positions predictably; the three-dimensional surface the Voronoi diagram represents changes in a continuous manner; the critical area of the layout changes continuously since it is a continuous function over this three dimensional surface; and when such motion causes a Voronoi bisector to collapse to zero-length, its critical area contribution converges to zero:

$$\lim_{\text{Vertex}(C,B,D) \to \text{Vertex}(A,B,D)} \text{Contribution(Bisector}(A,B,C,D)) = 0$$

A further observation is that the point at which a bisector collapses is a function of the involved edges in the design. In fact, it is the point at which the coordinates of the two vertices defining the bisector converge. Therefore, one can predict the state in which a particular critical area contribution equation is valid under continuous modification of edges in the design. Furthermore, after collapse, an expansion may occur when modification continues, resulting in the emergence of a new bisector with a critical area contribution. This transformation is predictable and stated as follows (see FIG. 5).

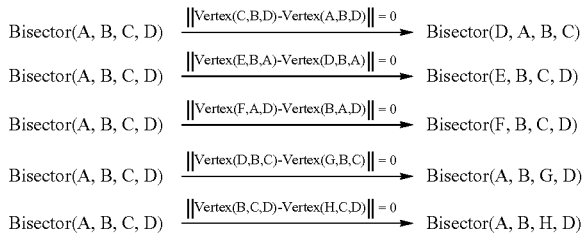

As illustrated, when Bisector (A, B, C, D) or a bisector adjacent to Bisector (A, B, C, D) in the Voronoi diagram collapses, a new bisector replaces Bisector (A, B, C, D). For example, suppose Vertex (B, C, D) and Vertex (H, C, D) are the first to converge. After convergence, Bisector (A, B, C, D) is replaced with Bisector (A, B, H, D) and therefore, Contribution (Bisector (A, B, C, D)) is replaced by Contribution (Bisector (A, B, H, D).

Note that the identification of the device shapes, etc. has been intentionally omitted from FIG. 5 to more clearly illustrate the invention, as mentioned above. The replacement of one vertex for another is shown in the following transformations.

For a Bisector (A, B, C, D) shown in FIG. 5 the critical area cost function is stated as follows.

$$\text{Cost(Bisector}(A, B, C, D)) = \begin{cases} \text{Contribution(Bisector}(A, B, C, D)) & \text{Space } I \\ \varepsilon \text{Contribution(Bisector}(A, B, C, D)) & \text{Space } II \end{cases}$$

Contribution accurately describes the critical area contribution of the Voronoi bisector within Space I. This is the space in which the edges in the design start. Space II is the space of variables in which Contribution no longer accurately describes the critical area contribution of the Voronoi bisector due to a collapse of the bisector or of an adjacent bisector. These two spaces are separated by a multi-dimensional surface defined by $$\|\text{Vertex }(C, B, D) - \text{Vertex }(A, B, D)\| = 0$$

$$\|\text{Vertex }(E, B, A) - \text{Vertex }(D, B, A)\| = 0$$

$$\|\text{Vertex }(F, A, D) - \text{Vertex }(B, A, D)\| = 0$$

$$\|\text{Vertex }(D, B, C) - \text{Vertex }(G, B, C)\| = 0$$

$$\|\text{Vertex }(B, C, D) - \text{Vertex }(H, C, D)\| = 0$$

where E, F, G, and H are those edges in the design relating to bisectors adjacent to Bisector (A, B, C, D) as in the earlier discussion. In the case where one accounts for topological change through the transformations previously described, the value of c should be set to zero. Otherwise, the invention chooses a value c with which to penalize the cost function within Space II. By this technique, it confines the cost function to variables associated with only four edges at a time within the design.

In other words, instead of statically calculating critical area contribution from a Voronoi diagram, the invention utilizes a plane normal to represent each Voronoi cell defined by various device edges in the integrated circuit design. Using these normals to calculate the Voronoi bisectors allows the invention to develop a cost function in terms of variables associated with the positions of device edges, independent of the Voronoi diagram itself. Therefore, when the positions of the device edges change, the values of each of the vertex coordinates will also change in accordance, thereby altering the critical area contribution. By presenting the critical area contribution as a cost function, the invention allows an optimization process to reduce the critical area contribution cost.

The invention associates this cost function with every Voronoi bisector Bisector (A, B, C, D) in the diagram. To extend the range of predictability, one can also associate cost functions with the possible transformations of Bisector (A, B, C, D) described by the previous section.

The critical area minimization objective is, therefore,

Objective: Minimize $$\sum_{fault} \sum_{Bisector\ B \in Voronoi(fault)} \sum_{Bisector(A,B,C,D) \in B \cup transformations\ of\ B} \text{Cost}$$
$$(\text{Bisector}(A, B, C, D))$$

In other words, the invention minimizes the sum of all costs from all bisectors, and transformations thereof (subject to constraints such as topological and ground-rule constraints), for every fault mechanism in the integrated circuit design.

A non-linear, multi-dimensional optimization algorithm may be used to solve the foregoing objective for the positions of all movable edges in the layout. Such algorithms are NP-complete or stochastic. Fortunately, there are a few simplifications that can be made to the cost function that would enable the use of a linear optimization algorithm, which is considerably more efficient.

Let a, b, c, d, be some constants. Let w represent the sum or difference of two variables; the set of variables being the x and y coordinate of all movable edges in the layout. Without loss of generality, apply the following simplifications. The example used herein assume orthogonal data, however, one ordinarily skilled would understand that any arbitrary angles could be used.

I. Restrict the set of variables to represent a single dimensional movement (other dimensions may be handled using various techniques, for example, constraining them to move with an adjacent orthogonal edge.) Then $$\vec{g}_K \in \{[-1,0,], [1,0,], [0,-1], [0,1], \beta_{[1,0]}, \beta_{[0,1]}\}$$

$$\vec{n}_K \in \{[1,0,1], [-1,0,1], [0,1,1], [0,-1,1], [1,0,0], [0,1,0]\}$$

The critical area contribution of a Voronoi bisector simplifies to $$\text{Contribution}(\text{Bisector}(A, B, C, D)) \in \left\{ a\frac{w_1}{w_2} + b, a \ln \frac{w_1}{w_2} + b \right\}$$

II. Ignore the effect of adjacent Voronoi bisectors collapsing and consider only the Voronoi bisector itself collapsing. Then the condition at which Contribution is no longer accurate can be expressed by $$cw_1 + dw_2 = 0$$

III. Solve the objective in two passes. In the first pass, consider only those variables which represent x-coordinates. In the second pass, consider only those variables which represent y-coordinates. Then $$\text{Contribution}(\text{Bisector}(A, B, C, D)) \in$$

$$\left\{ aw + b, \frac{a}{w} + b, a \ln w + b, a \ln w_1 + b \ln w_2 \right\}$$

IV. Approximate Contribution using a piecewise-linear function.

Actions I and II result in a cost function over sums or differences of variables. Actions III and IV result in cost functions that are convex and piecewise-linear. An efficient optimization algorithm such as graph-based simplex can then be applied.

In other words, allowing edges to move along a single axis (x-axis or y-axis) simplifies the cost function and enables it to be used within a linear optimization algorithm which is considerably more efficient that a general optimization algorithm.

There are a number of topologies that may exist within the Voronoi diagram which are not handled by the above cost function. These fall into one of two categories ambiguities and degeneracies. Ambiguities shall now be addressed.

An ambiguity is present when the plane normals on either side of a Voronoi bisector are parallel to each other as shown in FIG. 6A. For example, Bisector ({P, Q}, B, C, D) may have the property that $\vec{g}_B = \vec{g}_D$ and, consequently, $\vec{n}_B = \vec{n}_D$. Functions Vertex ({P, Q}, B, D) and Vertex (C, B, D) are only applicable when P, Q, B, D and C, B, D have non-parallel plane normals. For orthogonal data, modification to bisectors B and D may result in one of two scenarios shown in FIGS. 6B and 6C where a Voronoi cell emerges at the bisector.

To account for such changes, the following decomposition can be used

Bisector({P, Q}, B, C, D) →

$$\left\{ \begin{array}{l} \text{Bisector}(Q, P, C, D), \text{Bisector}(D, P, B, C), \\ \text{Bisector}(P, B, C, Q), \text{Bisector}(D, Q, B, C) \end{array} \right\}$$

-continued where $$\vec{g}_P \neq \vec{g}_Q, \vec{g}_P \perp \vec{g}_B, \text{ and } \vec{g}_Q \perp \vec{g}_B.$$

In a scenario such as this, where one accounts for topological change, the value c in the cost functions associated with bisectors resulting from the decomposition should be set to zero.

In other words, when a bisector is encountered with ambiguity, the invention decomposes the bisector to its potential forms during layout modification, resulting in unambiguous bisectors. This rule may be applied iteratively until no ambiguities are present. A cost function is then derived for every Voronoi bisector at the end of the decomposition. Under layout modification the cells 110 that emerge are initially of zero area and contribute no critical area to that of the overall layout. If one scenario becomes dominant, its associated cost functions will assert themselves within the space of predictability while those of the other scenarios are suppressed as a consequence of being outside the space of predictability. The overall effect is an accurate modeling of how critical area will change under layout modification in cases of ambiguity.

As mentioned above, there are a number of topologies that may exist within the Voronoi diagram which are not handled by the cost function and these fall into one of two categories ambiguities and degeneracies. Degeneracies shall now be addressed.

Figure 7B:
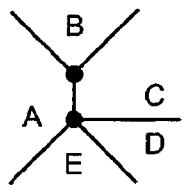
Figure 7C:
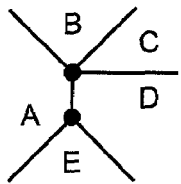
Figure 7D:
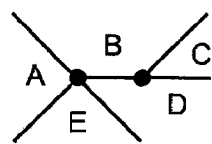
Figure 7E:
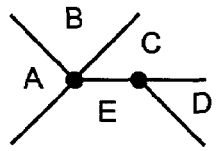
Figure 7F:
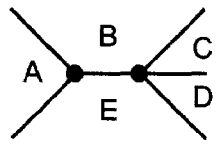

A degeneracy is present when more than three bisectors converge at a single Voronoi vertex, as shown in FIG. 7A. Modification to the layout may result in an emergence of one or more bisectors at this vertex, as shown in FIGS. 7B-7G. In other words, the invention decomposes these vertices into all possible scenarios that may result under layout modification, resulting in additional vertices and bisectors. FIGS. 7B-7G illustrate the different possibilities that can occur from FIG. 7A under layout modification. Thus, for every subset of four edges in the design defining the Voronoi vertex, the invention applies the following decomposition.

Vertex ({A, B, C, D})→{Bisector (A, B, C, D), Bisector (B, C, D, A)}

Additionally, the invention derives a cost function for every Voronoi bisector resultant from this decomposition. The Voronoi bisectors in this decomposition initially have zero-length and their critical area contribution is zero. As the bisectors grow in length, their cost functions move into the space of predictability and dominate those associated with Voronoi bisectors that do no emerge. In a scenario such as this, where one accounts for topological change, the value ϵ in the cost functions associated with bisectors resulting from the decomposition should be set to zero. The overall effect is an accurate modeling of how critical area will change under layout modification in cases of degeneracy.

Figure 8:
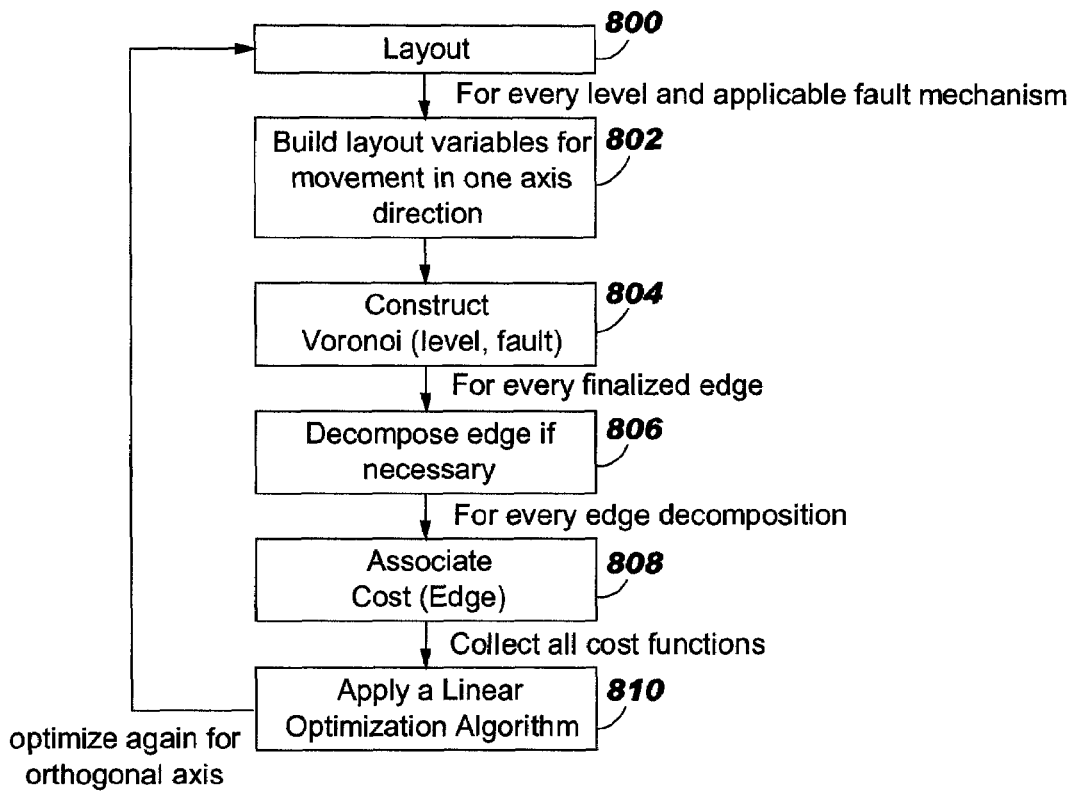
FIG. 8 is a flow diagram illustrating processing according to the invention.

FIG. 8 illustrates the flow for yield improvement using the critical area minimization objectives. More specifically, in item 800, the invention inputs an initial layout. For every applicable fault mechanism (parameterized by type of defect and the involved layout levels), the invention builds layout variables for movement in one axial direction (as shown in item 802). More specifically, the invention associates variables to the positional components of the edges that lie in a first direction in the initial integrated circuit design. Then, in item 804, the invention constructs Voronoi diagrams. The creation of these Voronoi diagrams occurs incrementally as processing moves across the integrated circuit design. As each Voronoi bisector is finalized, processing moves to item 806 which decomposes the bisector (eliminates ambiguity or degeneracy as discussed above).

Once each Voronoi bisector is decomposed, the invention associates a cost function in terms of critical area contributions of the Voronoi bisectors in item 808. As shown above, this cost function is a function of the positions and orientations (encoded as normals) of the edges, and the critical area contributions comprise a measure of electrical fault characteristics of the areas between the edges.

In items 810, the invention applies a linear optimization algorithm to all the cost functions that are collected from item 808 and processing optionally returns to item 800 to optimize for another axis (orthogonal, or any other useful direction (45 degrees, 60 degrees, etc.)). Thus, the invention optimizes the positions and length of the edges to reduce critical area contribution cost in the first direction across the integrated circuit design to produce a revised integrated circuit design and then, the invention repeats this process with the revised integrated circuit design in a different direction.

In a standard run, optimization is performed twice, once along each of the x and y axes. For further yield improvement, more iterations of this flow can be executed. This flow may be combined with the generation of other cost functions and objectives such as topological or ground-rule constraints and objectives. When combining multiple objectives, each should be weighted appropriately relative to each other.

FIGS. 9A-32C illustrate some possible Voronoi bisector configurations. More specifically, the "A" Figures (of FIGS. 9A-32C) illustrate the specific Voronoi bisector configuration and the appropriate cost functions for such Voronoi bisector configuration. In the "A" Figures, the arrows represent the direction of gradient. The "B" Figures (of FIGS. 9A-32C) illustrate the graphical results of the cost function in one direction and the "C" Figures (of FIGS. 9A-32C) illustrate the graphical results of the cost function in a direction orthogonal to the first direction. The illustrated cost functions also apply to configurations that are rotationally or reflectively symmetric to the drawn configuration.

Figure 33:
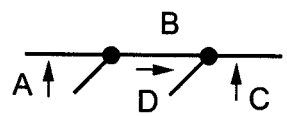
FIG. 33 illustrates Voronoi bisectors.
Figure 34:
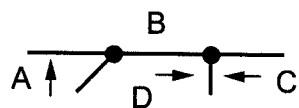
FIG. 34 illustrates Voronoi bisectors.
Figure 35:
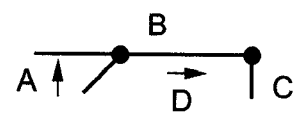
FIG. 35 illustrates Voronoi bisectors.

FIGS. 33-35 represent Voronoi bisector configurations which do not contribute a cost function to the optimization algorithm because modifications of the involved variables do not change their critical area contributions. For this reason, they are ignored and not included within the total of all cost functions (item 808).

Figure 36:
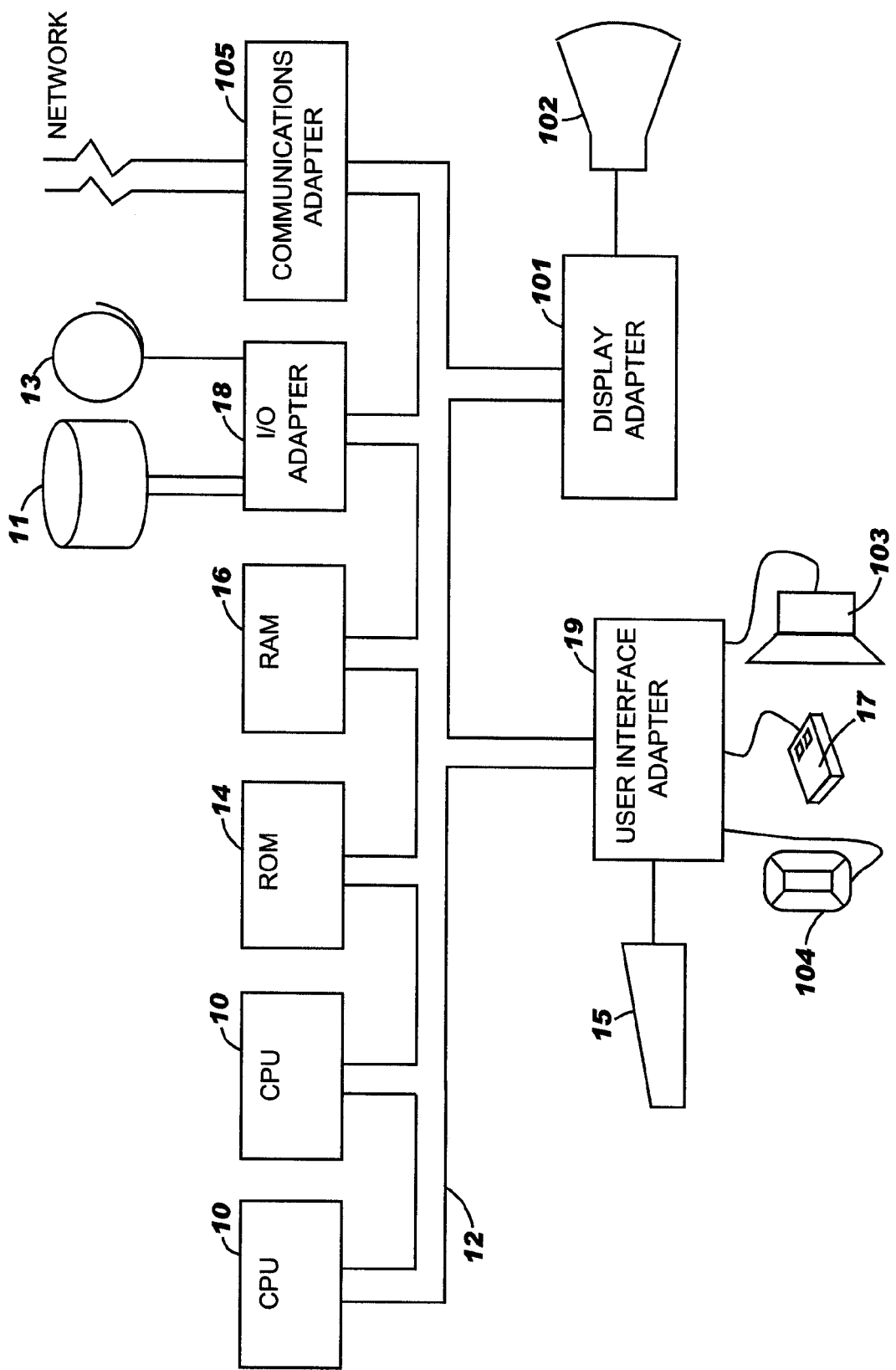
FIG. 36 is a hardware embodiment in which the invention can operate.

A representative hardware environment for practicing the present invention is depicted in FIG. 36, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate the invention also loaded onto the computer system.

Therefore, as shown above, the invention presents a method, system, program storage device, etc. that calculates and reduces critical area in an integrated circuit design. More specifically, the invention begins with an integrated circuit design as its initial input. It associates variables with the positions of edges in the integrated circuit design. It encodes the orientation of edges in the integrated circuit design as normals.

The invention defines cost functions of these variables in terms of the critical area contributions within the spacings for the edges associated with these variables. The critical area contributions comprise a measure of the electrical characteristics of the integrated circuit for a particular type of fault.

The invention associates cost functions of these variables with particular spacings among particular edges in the design. This process uses a three-dimensional representation of the Voronoi diagram constructed for the integrated circuit design for a particular type of electrical fault. In this process, the invention defines Voronoi cells as a mapping of points in the spacing between edges in the design to the minimum size of defects that trigger an electrical fault between them. The set of points where Voronoi cells meet define Voronoi bisectors. The end-points of these bisectors form Voronoi vertices.

The invention represents Voronoi cells, bisectors, and vertices using mathematical expressions, independent of the Voronoi diagram itself, over the variables associated with the edges of the integrated circuit design involved in the spacing. Based on these entities, the invention formulates cost functions which describe the critical area contributions of the spacing under continuous modification of the design.

The invention uses these cost functions in an optimization algorithm to modify the positions and length of the edges in the integrated circuit design to reduce critical area contribution cost. For improved efficiency with a linear optimization algorithm, the invention applies the optimization for variables in one direction across the integrated circuit design to produce a revised integrated circuit design. The invention optionally repeats this process using the revised integrated circuit design in another direction to further reduce critical area cost.

As we enable ourselves to build smaller and denser integrated circuits, their sensitivity to the occurrence of spot defects inherent in the manufacturing process becomes of greater importance. Such defects cause electrical faults within the circuit, contribute to yield loss, and ultimately result in lost resources. This invention addresses the problem by providing an automated means of optimizing a circuit design to reduce this sensitivity. Furthermore, the process described herein can be combined with other optimization objectives to achieve a balance of costs in the modified design.

While the invention has been described in terms of preferred embodiments, those skilled in the art will recognize that the invention can be practiced with modification within the spirit and scope of the appended claims.

The invention claimed is:

1. A method of calculating critical area in an integrated circuit design, said method comprising:
   inputting an integrated circuit design;
   constructing a Vornoi diagram for a particular fault mechanism based on a layout of device shapes in said initial integrated circuit design;
   associating variables with the positions of edges of said device shapes in said integrated circuit design;
   associating cost functions of said variables with spacing between said edges in said integrated circuit design;

defining said cost functions in terms of critical area contributions of linear bisectors between said edges of said device shapes, wherein said critical area contributions comprise a measure of electrical fault characteristics of said spacing between said edges of said device shapes, and wherein a critical area contribution of a given linear bisector is proportional to a cross product of an x-y difference vector between normal vectors of planes of Vornoi cells which meet at said given linear bisector and an x-y difference vector representing a length of said given linear bisector such that said critical area contribution of said given linear bisector is a function of said variables; and, optimizing said positions and length of said edges of said device shapes in said integrated circuit design to reduce critical area contribution cost in a first direction across said integrated circuit design to produce a revised integrated circuit.

2. The method in claim 1, wherein said process of associating said cost functions comprises mapping points in said spacing between said edges of said device shapes in said integrated circuit design up to when the size of defects located at said points triggers an electrical fault between said edges of said device shapes in said integrated circuit design, wherein said mapping forms said Voronoi cells.

3. The method in claim 1, wherein said process of associating said cost functions further comprises using a normal vector representing said Voronoi cells defined in terms of said variables.

4. The method in claim 1, wherein said linear bisectors are defined by vertices at the ends of said linear bisectors; and wherein said vertices are defined in terms of said variables.

5. A method of optimizing critical area in an integrated circuit design, said method comprising:
   a) inputting an initial integrated circuit design and constructing a Vornoi diagram for a particular fault mechanism based on a layout of device shapes in said initial integrated circuit design;
   b) associating variables with the positions of edges of said device shapes in said integrated circuit design;
   c) associating cost functions of said variables with spacing between said edges of said device shapes in said integrated circuit design,
      wherein said cost functions are defined in terms of critical area contributions of linear bisectors between said edges of said device shapes and
      wherein a critical area contribution of a given linear bisector is proportional to a cross product of an x-y difference vector between normal vectors of planes of Vornoi cells which meet at said given linear bisector and an x-y difference vector representing a length of said given linear bisector such that said critical area contribution of said given linear bisector is a function of said variables;
   d) optimizing said positions and length of said edges of said device shapes in said integrated circuit design to reduce critical area contribution cost in a first direction across said integrated circuit design to produce a revised integrated circuit design by using a linear optimization algorithm; and
   e) repeating steps b-d with said revised integrated circuit design in a second direction.

6. The method in claim 5, wherein said process of associating said cost functions comprises mapping points in said spacing between said edges of said device shapes in said integrated circuit design up to when the size of defects located at said points trigger an electrical fault between said edges of said device shapes in said integrated circuit design, wherein said mapping forms said Voronoi cells.

7. The method in claim 5, wherein said process of associating said cost functions further comprises using a normal vector representing said Voronoi cells defined in terms of said variables.

8. The method in claim 5, wherein said linear bisectors are defined by vertices at the ends of said linear bisectors; and wherein said vertices are defined in terms of said variables.

9. The method in claim 5, wherein said critical area contributions of said linear bisectors change with changes in said variables as a layout of said device shapes in said integrated circuit design changes during said optimizing.

10. A method of optimizing critical area in an integrated circuit design, said method comprising:
   a) inputting an initial integrated circuit design and constructing a Vornoi diagram for a particular fault mechanism based on a layout of device shares in said initial integrated circuit design;
   b) associating variables with the positions of edges of device shapes in said integrated circuit design;
   c) associating cost functions of said variables with spacing between said edges of said device shapes in said integrated circuit design,
      wherein said cost functions are defined in terms of critical area contributions of linear bisectors between said edges of said device shapes,
      wherein said critical area contributions comprise a measure of electrical fault characteristics of said spacing between said edges of said device shapes, and
      wherein a critical area contribution of a given linear bisector is proportional to a cross product of an x-y difference vector between normal vectors of planes of Vornoi cells which meet at said given linear bisector and an x-y difference vector representing a length of said given linear bisector such that said critical area contribution of said given linear bisector is a function of said variables;
   d) optimizing said positions and lengths of said edges of said device shapes in said integrated circuit design to reduce critical area contribution cost in a first direction across said integrated circuit design to produce a revised integrated circuit design by using a linear optimization algorithm; and
   e) repeating steps b-d with said revised integrated circuit design in a second direction.

11. The method in claim 10, wherein said process of associating said cost functions comprises mapping points in said spacing between said edges of said device shapes in said integrated circuit design up to when the size of defects located at said points triggers an electrical fault between said edges of said device shapes in said integrated circuit design, wherein said mapping forms said Voronoi cells.

12. The method in claim 10, wherein said process of associating said cost functions further comprises using a normal vector representing said Voronoi cells defined in terms of said variables.

13. The method in claim 10, wherein said linear bisectors are defined by vertices at the ends of said liner bisectors; and wherein said vertices are defined in terms of said variables.

14. The method in claim 13, wherein said critical area contributions of said linear bisectors change with changes in said variables as a layout of said device shapes in said integrated circuit design changes during said optimizing.

15. A program storage device readable by computer, tangibly embodied a program of instructions executable by said computer for performing a method of calculating critical area in an integrated circuit design, said method comprising:

inputting an integrated circuit design;

constructing a Vornoi diagram for a particular fault mechanism based on a layout of device shapes in said initial integrated circuit design;

associating variables with the positions of edges of said device shapes in said integrated circuit design;

associating cost functions of said variables with spacing between said edges in said integrated circuit design;

defining said cost functions in terms of critical area contributions of linear bisectors between said edges of said device shapes, wherein said critical area contributions comprise a measure of electrical fault characteristics of said spacing between said edges of said device shapes, and wherein a critical area contribution of a given linear bisector is proportional to a cross product of an x-y difference vector between normal vectors of planes of Vornoi cells which meet at said given linear bisector and an x-y difference vector representing a length of said given linear bisector such that said critical area contribution of said given linear bisector is a function of said variables; and, optimizing said positions and length of said edges of said device shapes in said integrated circuit design to reduce critical area contribution cost in a first direction across said integrated circuit design to produce a revised integrated circuit.

16. The program storage device in claim 15, wherein said process of associating said cost functions comprises mapping points in said spacing between said edges of said device shapes in said integrated circuit design up to when the size of defects located at said points triggers an electrical fault between said edges of said device shapes in said integrated circuit design, wherein said mapping forms said Voronoi cells.

17. The program storage device in claim 15, wherein said process of associating said cost functions further comprises using a normal vector representing said Voronoi cells defined in terms of said variables.

18. The program storage device in claim 15, wherein said linear bisectors are defined by vertices at the ends of said linear bisectors; and wherein said vertices are defined in terms of said variables.

19. The program storage device in claim 15, wherein said critical area contributions of said linear bisectors change with change in said variables as a layout of said device shapes in said integrated circuit design changes during said optimizing.

20. A system for calculating critical area in an integrated circuit design, said system comprising:

means for inputting an integrated circuit design and constructing a Vornoi diagram for a particular fault mechanism based on a layout of device shares in said initial integrated circuit design;

means for associating variables with the positions of edges of device shapes in said integrated circuit design; and means for associating cost functions of said variables with spacing between said edges in said integrated circuit design;

wherein said cost functions are defined in terms of critical area contributions of linear bisectors between said edges of said device shapes, wherein said critical area contributions comprise a measure of electrical fault characteristics of said spacing between said edges of said device shapes in said integrated circuit design, and wherein a critical area contribution of a given linear bisector is proportional to a cross product of an x-y difference vector between normal vectors of planes of Vornoi cells which meet at said given linear bisector and an x-y difference vector representing a length of said given linear bisector such that said critical area contribution of said given liner bisector is a function of said variables.

21. A method of optimizing critical area in an integrated circuit design, said method comprising:

inputting an initial integrated circuit design;

constructing a Vornoi diagram for a particular fault mechanism based on a layout of device shapes in said initial integrated circuit design;

associating variables with the positions of edges of said device shapes in said integrated circuit design;

associating cost functions of said variables with spacing between said edges in said integrated circuit design;

defining said cost functions in terms of critical area contributions of linear bisectors between said edges of said device shapes, wherein a critical area contribution of a given linear bisector is proportional to a cross product of an x-y difference vector between normal vectors of planes of Vornoi cells which meet at said given linear bisector and an x-y difference vector representing a length of said given linear bisector such that said critical area contribution of said given linear bisector is a function of said variables; and optimizing said positions and length of said edges of said device shapes in said integrated circuit design to reduce critical area contribution cost in a first direction across said integrated circuit design to produce a revised integrated circuit design by using a linear optimization algorithm.

22. The method in claim 21, wherein said process of associating said cost functions comprises mapping points in said spacing between said edges of said device shapes in said integrated circuit design up to when the size of defects located at said points triggers an electrical fault between said edges of said device shapes in said integrated circuit design, wherein said mapping form said Voronoi cells.

23. The method in claim 22, wherein said process of associating said cost functions further comprises using a normal vector representing said Voronoi cells defined in terms of said variables.

24. The method in claim 21, wherein said linear bisectors are defined by vertices at the ends of said linear bisectors; and wherein said vertices are defined in terms of said variables.

25. The method in claim 24, wherein said critical area contributions of said linear bisectors change with changes in said variables as a layout of said device shapes in said integrated circuit design changes during said optimizing.

26. A method of optimizing critical area in an integrated circuit design, said method comprising:

constructing a Vornoi diagram for a particular fault mechanism based on a layout of device shapes in an integrated circuit design, wherein said constructing of said Vornoi diagram comprises forming a plurality of cells with boundaries that comprise linear bisectors between edges of said device shapes;

calculating a critical area contribution for each linear bisector, wherein said critical contribution for said each linear bisector is proportional to a cross product of an x-y difference vector between normal vectors of planes which meet at said each linear bisector and an x-y difference vector representing a length of said each linear bisector such that said corresponding critical area contribution of said each linear bisector is a function of orientations and positions of said edges of said device shapes;

presenting said corresponding critical area contributions for each of said linear bisectors as costs; and, using a linear optimization algorithm to modify said layout of said device shapes such that a sum of said costs for all of said linear bisectors is minimized.

27. The method in claim 26, wherein said forming of said plurality of cells comprises mapping points in spacing between said edges of said device shapes up to when the size of defects located at said points triggers an electrical fault between said edges of said device shapes in said integrated circuit design.

28. The method in claim 26, wherein said Voronoi bisectors are defined by vertices at the ends of said Voronoi bisectors and wherein said vertices are defined in terms of said orientations and said positions of said edges of said device shapes.

29. The method in claim 26, further comprising before said modifying, predicting changes in said critical area contribution for each of said linear bisectors as a result of subsequent layout modifications.

30. A program storage device readable by computer, tangibly embodied a program of instructions executable by said computer for performing a method of calculating critical area in an integrated circuit design, said method comprising:

constructing a Vornoi diagram for a particular fault mechanism based on a layout of device shapes in an integrated circuit design, wherein said constructing of said Vornoi diagram comprises forming a plurality of cells with boundaries that comprise linear bisectors between edges of said device shapes;

calculating a critical area contribution for each linear bisector, wherein said critical contribution for said each linear bisector is proportional to a cross product of an x-y difference vector between normal vectors of planes which meet at said each linear bisector and an x-y difference vector representing a length of said each linear bisector such that said corresponding critical area contribution of said each linear bisector is a function of orientations and positions of said edges of said device shapes;

presenting said corresponding critical area contributions for each of said linear bisectors as costs; and, using a linear optimization algorithm to modify said layout of said device shapes such that a sum of said costs for all of said linear bisectors is minimized.

31. The method in claim 30, wherein said forming of said plurality of cells comprises mapping points in spacing between said edges of said device shapes up to when the size of defects located at said points triggers an electrical fault between said edges of said device shapes in said integrated circuit design.

32. The method in claim 30, wherein said Voronoi bisectors are defined by vertices at the ends of said Voronoi bisectors and wherein said vertices are defined in terms of said orientations and said positions of said edges of said device shapes.

33. The method in claim 30, further comprising before said modifying, predicting changes in said critical area contribution for each of said linear bisectors as a result of subsequent layout modifications.

* * * * *